(12) United States Patent
Dernier

(10) Patent No.: US 9,363,547 B2
(45) Date of Patent: Jun. 7, 2016

(54) SET TOP BOX HAVING RESET BUTTON AND LIGHT GUIDE

(75) Inventor: William Philip Dernier, Indianapolis, IN (US)

(73) Assignee: Thomson Licensing, Issy les Moulineaux (FR)

( * ) Notice: Subject to any disclaimer, the term of this patent is extended or adjusted under 35 U.S.C. 154(b) by 315 days.

(21) Appl. No.: 14/002,197

(22) PCT Filed: Mar. 7, 2012

(86) PCT No.: PCT/US2012/027995
§ 371 (c)(1),
(2), (4) Date: Aug. 29, 2013

(87) PCT Pub. No.: WO2012/122226
PCT Pub. Date: Sep. 13, 2012

(65) Prior Publication Data
US 2013/0340025 A1      Dec. 19, 2013

Related U.S. Application Data

(60) Provisional application No. 61/464,778, filed on Mar. 9, 2011.

(51) Int. Cl.
| G06F 1/16 | (2006.01) |
| H05K 5/00 | (2006.01) |
| H05K 7/00 | (2006.01) |
| H04N 21/41 | (2011.01) |
| H04N 5/64 | (2006.01) |
| H04N 21/443 | (2011.01) |
| G06F 1/20 | (2006.01) |

(Continued)

(52) U.S. Cl.
CPC .................. *H04N 21/41* (2013.01); *G06F 1/20* (2013.01); *H04N 5/64* (2013.01); *H04N 21/4432* (2013.01); *H05K 7/20154* (2013.01); *G06F 1/24* (2013.01); *H01H 2221/024* (2013.01); *H01H 2223/01* (2013.01); *H01H 2237/002* (2013.01)

(58) Field of Classification Search
CPC ........................................................ G06F 1/16
USPC ...................... 361/679.01; 200/5 A, 5 R, 6 A
See application file for complete search history.

(56) References Cited

U.S. PATENT DOCUMENTS

| 3,281,730 A | 10/1966 | Marot et al. |
| 4,388,508 A | 6/1983 | Wilson |
| 5,517,165 A | 5/1996 | Cook |

(Continued)

FOREIGN PATENT DOCUMENTS

| CN | 101449442 | 6/2009 |
| CN | 201352820 Y | 11/2009 |

(Continued)

*Primary Examiner* — Anthony Haughton
(74) *Attorney, Agent, or Firm* — Robert D. Shedd; Jerome G. Schaefer

(57) ABSTRACT

A set top box comprises a front wall; a first printed circuit board on an interior surface of the front wall; an actuation reset switch on the first printed circuit board on a side of the first printed circuit board opposite the front wall; and a reset button assembly having a fulcrum between an activation end and reset button end, wherein the reset button end has a reset button and the activation end has an actuation prong, wherein the actuation prong faces the actuation reset switch and the reset button faces the same direction as actuation prong.

15 Claims, 6 Drawing Sheets

(51) Int. Cl.
*H05K 7/20* (2006.01)
*G06F 1/24* (2006.01)

(56) References Cited

U.S. PATENT DOCUMENTS

| | | | |
|---|---|---|---|
| 6,141,213 A | 10/2000 | Antonuccio et al. | |
| 6,231,444 B1 | 5/2001 | Goto et al. | |
| 6,373,697 B1 | 4/2002 | Lajara et al. | |
| 6,600,525 B1 | 7/2003 | Sawai et al. | |
| 6,667,447 B2 * | 12/2003 | Liu | H01H 25/041 200/17 R |
| 6,835,902 B2 * | 12/2004 | Hiraoka | H01H 13/702 200/200 |
| 7,041,917 B2 * | 5/2006 | Tada | H01H 25/041 200/341 |
| 7,189,932 B2 * | 3/2007 | Kim | H01H 25/041 200/17 R |
| 7,239,973 B2 | 7/2007 | Schahl et al. | |
| 7,323,986 B2 | 1/2008 | Hunter et al. | |
| 7,342,779 B2 | 3/2008 | Knight | |
| 7,381,919 B1 | 6/2008 | Yu et al. | |
| 7,649,736 B2 | 1/2010 | Hongo | |
| 8,902,588 B2 * | 12/2014 | Ritter | H05K 7/20445 165/185 |
| 2003/0127307 A1 * | 7/2003 | Liu | H01H 25/041 200/5 R |
| 2003/0177506 A1 | 9/2003 | Wu | |
| 2005/0125842 A1 | 6/2005 | Calmels et al. | |
| 2005/0199476 A1 * | 9/2005 | Kim | H01H 25/041 200/5 R |
| 2006/0215357 A1 * | 9/2006 | Green | G06F 1/20 361/678 |
| 2007/0274012 A1 | 11/2007 | Bonasia et al. | |
| 2009/0148638 A1 * | 6/2009 | Kishi | H05K 5/0013 428/35.7 |
| 2009/0206059 A1 | 8/2009 | Kiko | |
| 2010/0097768 A1 * | 4/2010 | Ishii | H01L 23/4006 361/719 |
| 2010/0101925 A1 | 4/2010 | Tao et al. | |
| 2010/0243418 A1 | 9/2010 | Machida et al. | |
| 2013/0347051 A1 * | 12/2013 | Bose | H04N 21/418 725/151 |

FOREIGN PATENT DOCUMENTS

| | | |
|---|---|---|
| DE | 3034540 | 5/1982 |
| EP | 2709713 | 3/1995 |
| FR | 2709713 A1 | 3/1995 |
| JP | S61-83227 U | 6/1986 |
| JP | S63-108138 U | 7/1988 |
| JP | H09-161607 | 6/1997 |
| JP | 2000-173393 A | 6/2000 |
| JP | 2003-288131 | 10/2003 |
| JP | 2004-363525 | 12/2004 |
| JP | 2005-182857 | 7/2005 |
| JP | 2005-521341 | 7/2005 |
| JP | 2007-142434 | 6/2007 |
| JP | 2007-324339 | 12/2007 |
| WO | WO2007137180 A2 | 11/2007 |

* cited by examiner

SET TOP BOX HAVING RESET BUTTON AND LIGHT GUIDE

CROSS-REFERENCE TO RELATED APPLICATIONS

This application claims the benefit, under 35 U.S.C. §365 of International Application PCT/US12/027995, filed Mar. 7, 2012 which was published in accordance with PCT Article 21(2) on Sep. 13, 2012 in English and which claims the benefit of U.S. provisional patent application No. 61/464,778, filed Mar. 9, 2011.

FIELD OF THE INVENTION

The invention relates to a set top box and, in particular, to a set top box having an easily accessible reset button and light guide.

BACKGROUND

In many conventional set top boxes, the resetting of the set top box requires the activation of a reset tack switch which is located on the main printed circuit board. Generally, the main printed circuit board is a horizontal planar structure and the tack switch is on the top portion of the main printed circuit board. The tack switch in such a position inside the set top box is not easily accessible and generally requires some button, access aperture or the like near an exterior surface of the set top and further requires an electrical cable to activate the tack switch through the button, access aperture or the like.

In light of the ever increasing need to miniaturize or reduce the size of set top boxes due to consumer preference, the need exists to develop set top boxes having no internal cables or a smaller number of cables and having other design features conducive to a compact space efficient size. It is important to note that compactness can make thermal management a challenge. As such, for preferred set top boxes to function properly for an extended life, such set top boxes must still have suitable thermal management systems.

SUMMARY

Accordingly, the invention was devised in light of the problems described above, and an object of the invention, inter alia, is to provide an electronic device such as a set top box having a compact space efficient design. The electronic device comprises a front wall; a first printed circuit board on an interior surface of the front wall; an actuation reset switch on the first printed circuit board on a side of the first printed circuit board opposite the front wall; and a reset button assembly having a fulcrum between an activation end and reset button end, wherein the reset button end has a reset button and the activation end has an actuation prong. The actuation prong and the reset button can both face the same direction. The reset button assembly can be configured to reset the electronic device when the inward force is applied to the reset button, wherein the inward force causes the reset button assembly to rotate about the fulcrum such that the actuation prong applies a forward activation force to the actuation reset switch to initiate the reset. A spring leg that faces the interior surface can be provided that is perpendicular to the interior surface, wherein the spring leg is between the fulcrum and the actuation prong and the spring leg secures the reset button assembly in position such that the actuation prong is adjacent the actuation reset switch and positioned to activate the actuation reset switch when the inward force is applied. The electronic device can also have a second printed circuit board that is horizontal and perpendicular to the first printed circuit board, wherein a smart card reader is on the second printed circuit board. The electronic device can also have a top heat sink having a planar peripheral portion surrounding a central depression portion, wherein the central depression portion contacts a heat generating component on the second printed circuit board. The electronic device can further comprise a cooling air intake vent on a bottom side of the electronic device and under the hard drive; an exhaust fan on a rear wall of the electronic device; and a cooling air channel that is positioned under at least part of the hard drive and is between the cooling air intake vent and the exhaust fan. An interior partition wall can be positioned in the device such that the hard drive and cooling air channel are on one side of the partition wall and the smart card reader and the top heat sink are on an opposite of the partition wall.

BRIEF DESCRIPTION OF THE DRAWINGS

The invention will be explained in detail with reference to embodiments, referring to the drawings, in which.

DETAILED DESCRIPTION OF THE EMBODIMENTS

Figure 1:
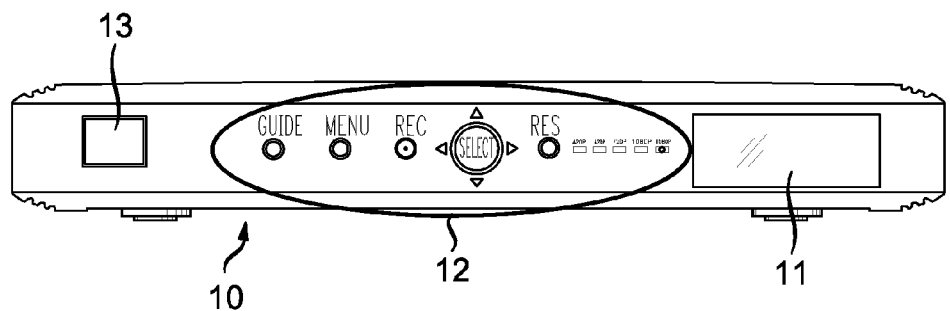
FIG. 1 is a plan front view of a set top box according to the invention.
Figure 2:
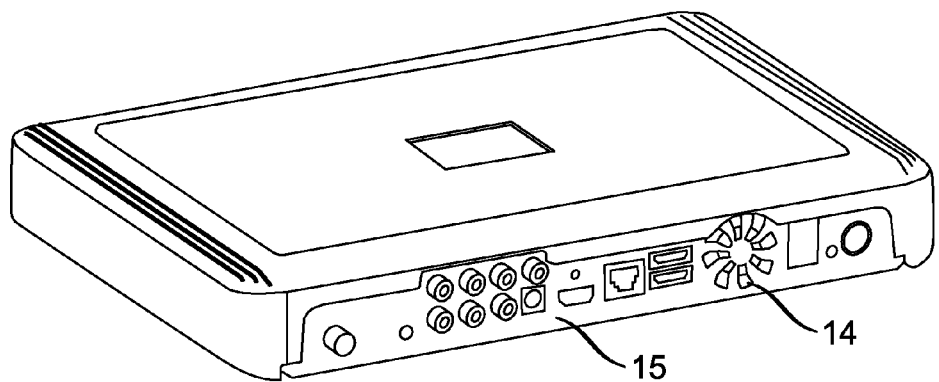
FIG. 2 is a perspective rear view of a set top box according to the invention.

The set top box 10 according to the invention having a novel reset button mechanism, light guide and thermal management system will now be described with reference to FIGS. 1-7. FIG. 1 shows a plan view of the front side of the set top box 10 in which the front side includes a bay door 11, a power button 13, and a front panel 12 that has surface artwork and provides various control buttons. FIG. 2 shows a perspective rear view of a set top box 10 in which the rear wall 15 includes a bank of various electrical connectors and a vented exhaust fan 14 to assist in thermal management.

Figure 3A:
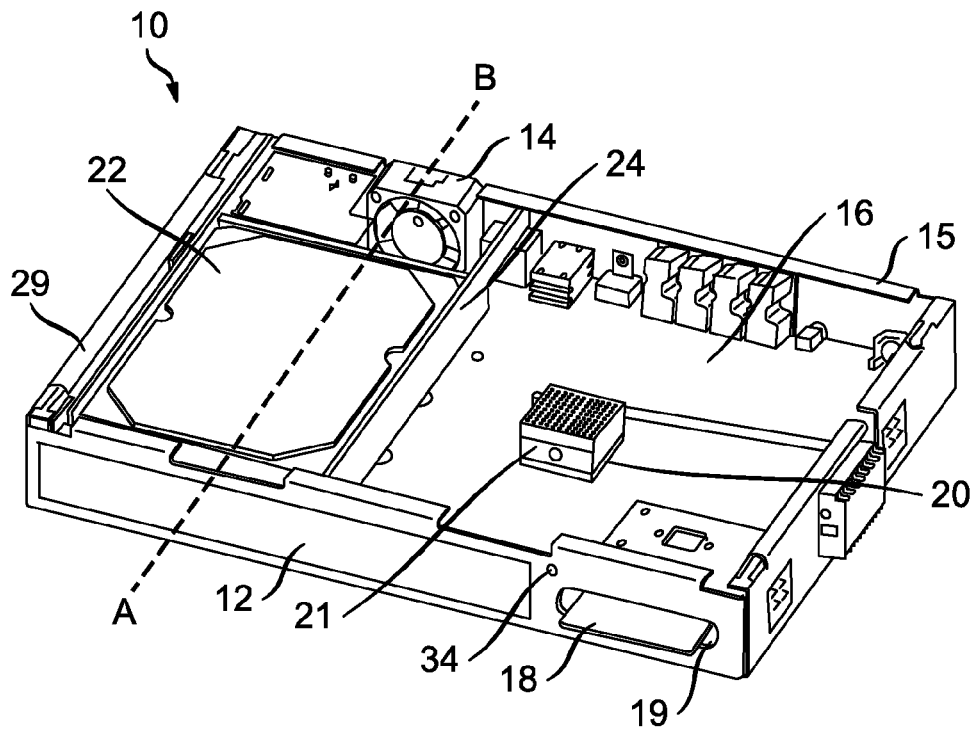
FIG. 3 shows perspective interior views of a set top box and components therein according to the invention.
Figure 3B:
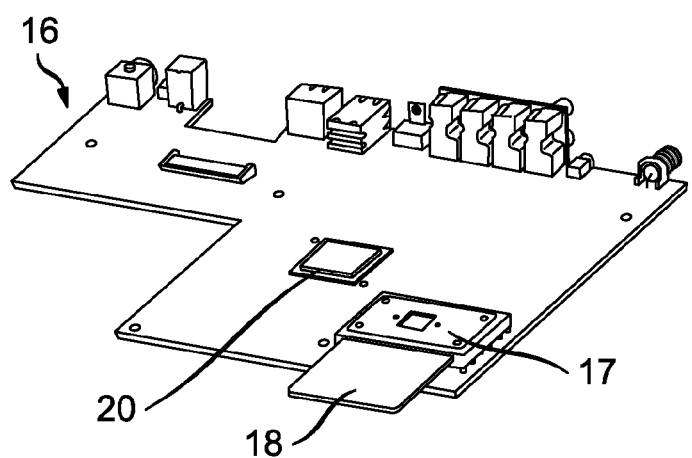
Figure 3C:
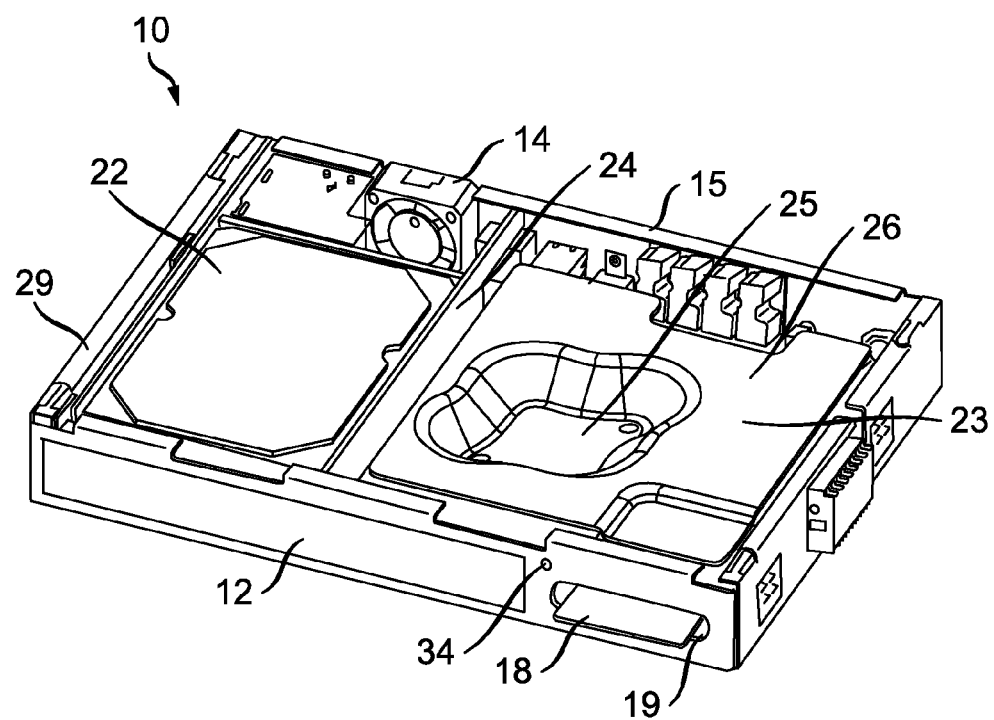

With reference to FIG. 3, the set top box has a novel thermal management system that includes a thermal partition wall 24 that partitions a hard drive section having a hard drive 22 from a smart card section having the smart card reader 17. FIG. 3 shows perspective interior views of this set top box 10 and components therein. This system includes the reset button 34 on a second printed circuit board 32 (not shown). The second printed circuit board 32 assists in thermal management by virtue of having it and any heat generating elements thereon spaced apart from the main printed circuit board 16 and heat generating elements thereon in the set top box 10. FIG. 3A in particular shows the set top box 10 having a generalized front panel 12, wherein the top of set top box and the door 11 to the smart card bay or port 19 are removed to show the interior features. In this the example, the exhaust fan 14 is behind a hard drive 22 which can be on one side of the set top box 10 and can be either on the printed circuit board 16 or adjacent to the printed circuit board 16. FIG. 3B shows the printed circuit board 16 in which the circuit board can have thermal pad 20 on it to assist with heat extraction from heat generating components on or near the printed circuit board 16. The thermal pad 20 assists with heat extraction when a heat sink is placed on it. This heat extraction feature can be important, because the smart card 18 in the smart card reader 17 generally generates substantial heat. The heat sink can include the heat sink contact 21 and a top broad heat sink 23. Top broad heat sink 23 has proved to be an effective way to cool the main integrated circuit of the set top box. FIGS. 3A and 3C show a partition wall 24 that runs parallel to the cooling air channel and is perpendicular to the front wall and rear wall of the set top box and extends therebetween. The partition wall 24 separates the hard drive from the broad heat sink over the circuit board 16. The circuit board 16 can span the length of the rear wall 15.

The top broad heat sink 23 shown in FIG. 3C can be a generally contoured plate that has a generally planar periphery and a contoured central feature 25 such as a pocket, central depression, notch, recess, multilevel depression, or mesa extending from and/or into a plane of the planar periphery, wherein the planar periphery preferably surrounds the central depression. In the illustrated embodiment, the planar periphery 26 surrounds 3 or 4 sides of the central depression feature 25. The central feature or central depression 25 can have side walls extending from the planar periphery and form an obtuse angle therewith. The contoured feature can optionally have a flat bottom designed to contact the main integrated circuit and/or other heat generating component on a main printed circuit board 16 which can be below it.

Figure 4:
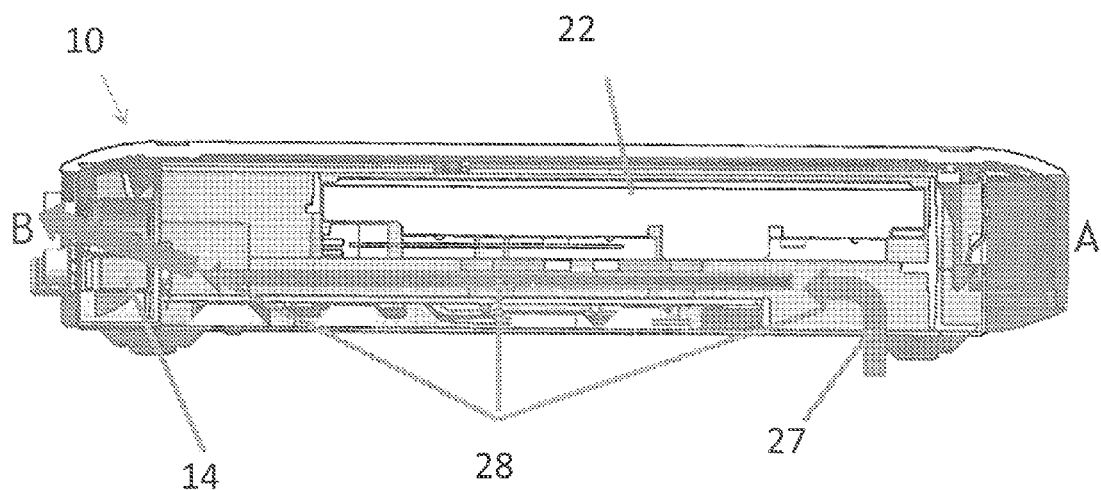
FIG. 4 is a cross sectional interior view a set top box according to the invention.

FIG. 4 shows an additional feature of thermal management for the set top box 10 in which air is drawn into the set top box through air intake vent 27. FIG. 4 is a cross section A-B of the set top box 10 in FIG. 3A on the hard drive side of the set top box. Here, the hard drive section has a cooling air channel 27 between an exhaust fan 14 on the rear wall of the set top box and a cooling air intake vent 27 on a bottom wall of the set top box near or adjacent the front wall. The air channel 28 is further defined or confined by the hard drive 22, hard drive case, or circuit board above it and a lateral side wall 29 of the set top box and the partition wall 24. The cooling air intake vent 27 is preferably closer to the front wall than the rear wall 15 to increase the length of the air channel 28. With the hard drive in place, the system permits air to flow from the cooling air intake vent and out of the set top box through the exhaust fan. In sum, the thermal management system is such that (1) on the smart card side of the partition wall 24, heat is transferred to the top broad heat sink 23 and radiated to the top of the set top box, thereby permitting heat to distribute and radiate out; and (2) on the hard drive side of the partition wall 24, heat from the hard drive 22 is extracted by the air flow by air contacting the surface of the component wall contacting the hard drive 22 or the bottom of the hard drive. The air moves backward through the exhaust fan 14 and out through the fan vents on the back wall of the set top box 10 shown in FIG. 2.

Figure 5:
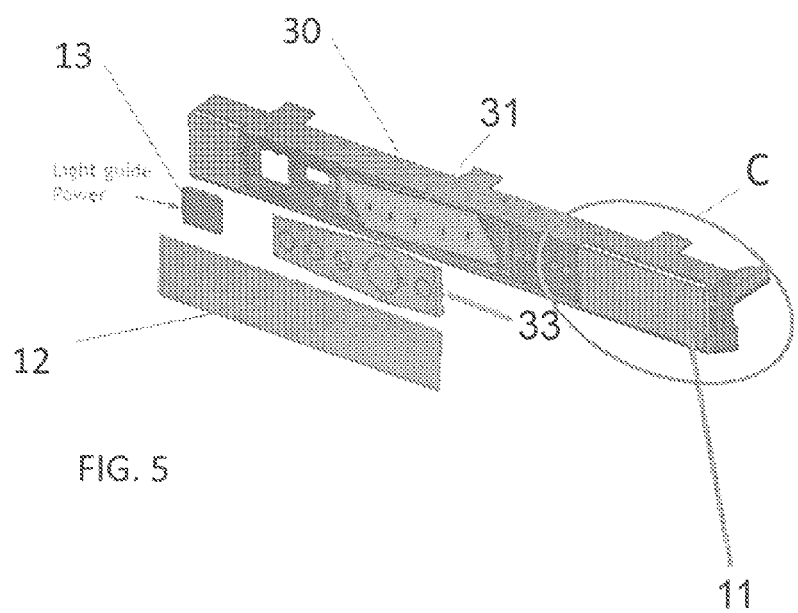
FIG. 5 is a perspective view of the front end assembly of the set top box according to the invention.

FIG. 5 is a perspective view of the front end assembly of the set top box 10. The front end assembly has a front end wall frame 30 having a light blocking bezel 31 with apertures for light transmission from switches that can be on the front panel circuit board 32. The bezel 31 can then have a light guide 33 to appropriately distribute or diffuse the light through the apertures of the bezel. The light source can be on the front circuit board 32. A transparent or translucent front panel 12 can then be on the light guide 33 and/or bezel 31. This front panel 12 can have surface artwork thereon. At one lateral end of the front panel 12 is a smart card port access door 11 behind which are the smart car port 19 and the reset button 34. The power button 13 can be on the other side of the front panel 12 opposite the door 11. The power button 13 at the other lateral end of the front panel can optionally be covered by the front panel 12. A means for illuminating graphics on the front panel is provided when there is thickness constraint in order to keep the set top box small. This illuminating means enables a structure in which there is no air between front panel and printed circuit board to allow touch sensitive buttons, thereby eliminating parts (such as optical components and/or cables) and eliminating gaps.

Figure 6:
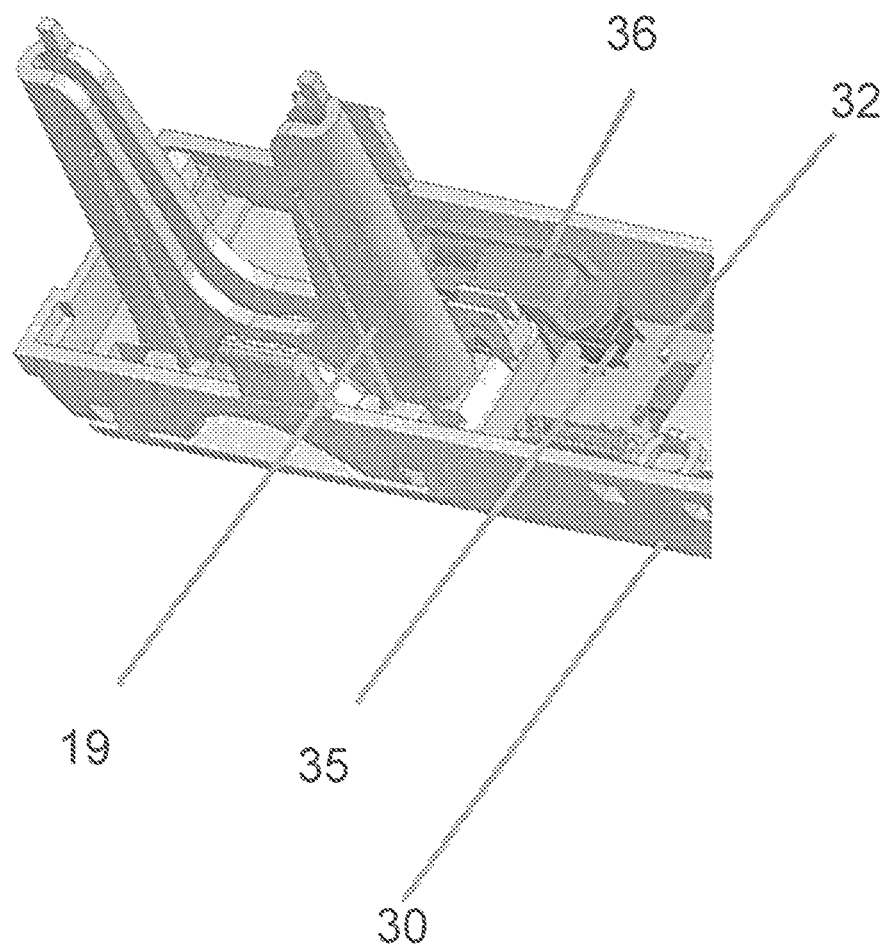
FIG. 6 is a rear perspective view of the reset button assembly on the front end assembly.

FIG. 6 is a rear view of the reset button assembly 36 on the front end assembly which is behind the door 11 shown in section C in FIG. 5. The reset button assembly is shown being on front end wall frame 30 above the smart card port 19. There is an actuation reset switch 35 that is on the front panel circuit board 32. This switch 35 actually resets the set top box when activated.

Figure 7:
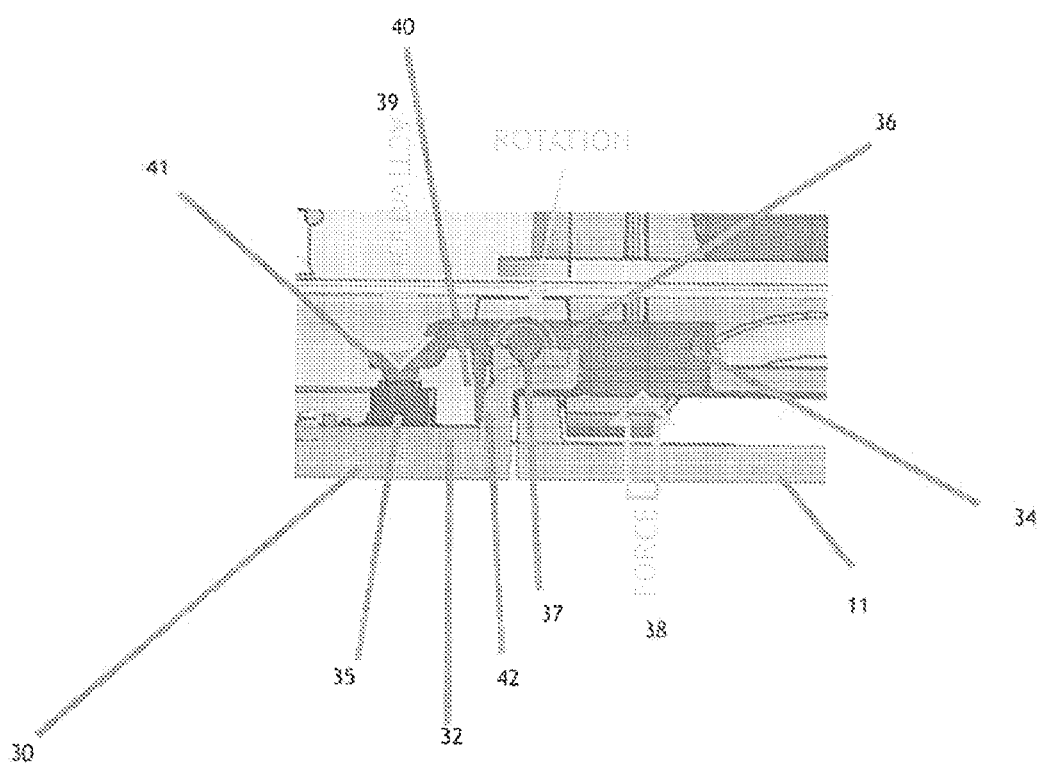
FIG. 7 is a cross sectional view of the reset button assembly.

FIG. 7 is a cross sectional view of the reset button assembly or mechanism 36. In FIG. 7, the mechanism 36 is shown being behind the door 11 and the front end wall frame 30. The door 11 is designed to swing open to permit access to button 34. The mechanism 36 has an activation or actuation end 41 which applies forward activation force 39 to actuation reset switch 35 on the interior side of the front panel printed circuit board 32. The front panel printed circuit board 32 can be vertically oriented on the front of the set top box and can be perpendicular to the horizontal main printed circuit board 16. The activation end 41 can have a prong that makes contact with the actuation reset switch 35. The actuation switch 35 can be a microswitch. The force 39 applied to the actuation switch 36 is in the opposite direction to the rearward application force or inward force 38 applied to the reset button 34 at the distal end of the mechanism 36 that is opposite the activation end 41. The mechanism 36 has a fulcrum 37 that sits in a fulcrum pocket in the front end wall frame 30. The inward force 38 can be force exerted from a user's finger to the button end 34. The force 38 rotates the mechanism 36 counterclockwise in FIG. 7 about the fulcrum 37 and consequently applies activation force 39 at the actuator end 41. Hence, the activation force 39 is applied the tact switch or actuation reset switch 35 through the activation end 41 or a prong on the activation end 41. There is a spring leg 40 which can be generally perpendicular to the length of mechanism 36 and the front of the set top box and extends from the mechanism toward the front of the set top box. The spring leg 40 is positioned on the activation end side of the fulcrum 37. The spring leg 40 can further keep the mechanism rotated or positioned so the button end 34 and the activation end 41 are in the proper place and the reset switch is not activated until inward force 38 is applied. A side of spring leg 40 facing the fulcrum can contact and apply a lateral force away from the activation end on the vertically oriented spring leg wall 42 which is perpendicular to the front wall. This prevents the actuation reset switch 35 from being activated until the button 34 is pressed.

Because the circuit boards and/or the components thereon generally generate heat, having two boards as in embodiments of the invention that provide different functionalities enhances the spreading and distribution of the heat generated in the set top box. This is advantageous in that it avoids localizing heat and provides greater opportunities for heat dispersion. The partition wall helps to further optimize heat dispersion by contacting and forming the air channel 27.

It should be understood that the drawings are for purposes of illustrating the concepts of the disclosure and are not necessarily the only possible configurations for illustrating the disclosure. For example, although the examples are mentioned with regard to a set top box and smart cards, the invention is applicable to other electronics devices having hard drives and these other devices can have types of information cards other than smart cards.

The invention claimed is:

1. An electronic device, comprising:
   a front wall;
   a first printed circuit board on an interior surface of the front wall;
   an actuation reset switch on the first printed circuit board, the actuation reset switch extending from a side of the first printed circuit board opposite the front wall; and
   a reset button assembly having a fulcrum between an activation end and a reset button end, wherein the reset button end has a reset button and the activation end has an actuation prong, the actuation prong faces the actuation reset switch such that the actuation prong and the reset button extend from the reset button assembly in a same direction.

2. The electronic device of claim 1, wherein the reset button assembly is configured to reset the electronic device when an inward force is applied to the reset button, the inward force causes the reset button assembly to rotate about the fulcrum such that the actuation prong applies a forward activation force to the actuation reset switch to initiate the reset, the inward force and forward activation force being in opposite directions.

3. The electronic device of claim 2, further comprising a spring leg that faces the interior surface and is perpendicular to the interior surface, the spring leg being between the fulcrum and the actuation prong, the spring leg secures the reset button assembly in position such that the actuation prong is adjacent the actuation reset switch and positioned to activate the actuation reset switch when the inward force is applied.

4. The electronic device of claim 3, further comprising:
   a second printed circuit board, the second printed circuit board being horizontal and being perpendicular to the first printed circuit board; and
   a smart card reader on the second printed circuit board.

5. The electronic device of claim 4, further comprising a top heat sink having a planar peripheral portion surrounding a central depression portion, the central depression portion contacting a heat generating component on the second printed circuit board.

6. The electronic device of claim 3, further comprising:
   a second printed circuit board, the second printed circuit board being horizontal and being perpendicular to the first printed circuit board; and
   a hard drive on or adjacent to the second printed circuit board.

7. The electronic device of claim 6, further comprising:
   a cooling air intake vent on a bottom side of the electronic device and under the hard drive;
   an exhaust fan on a rear wall of the electronic device; and
   a cooling air channel positioned under at least part of the hard drive and between the cooling air intake vent and the exhaust fan.

8. The electronic device of claim 5, further comprising:
   a hard drive on or adjacent to the second printed circuit board;
   a cooling air intake vent on a bottom side of the electronic device and under the hard drive;
   an exhaust fan on a rear wall of the electronic device; and
   a cooling air channel positioned under at least part of the hard drive and between the cooling air intake vent and the exhaust fan.

9. The electronic device of claim 8, further comprising:
   a partition wall, wherein the hard drive and the cooling air channel are on one side of the partition wall and the smart card reader and the top heat sink are on an opposite side of the partition wall.

10. The electronic device of claim 1, wherein the electronic device is a set top box.

11. The electronic device of claim 3, further comprising:
    a second printed circuit board; and
    an information card reader on the second printed circuit board.

12. The electronic device of claim 11, further comprising a top heat sink having a planar peripheral portion surrounding a central depression portion, the central depression portion contacting a heat generating component on the second printed circuit board.

13. The electronic device of claim 12, further comprising:
    a cooling air intake vent on a bottom side of the electronic device and under the hard drive;
    an exhaust fan on a rear wall of the electronic device; and
    a cooling air channel positioned under at least part of the hard drive and between the cooling air intake vent and the exhaust fan.

14. The electronic device of claim 3, further comprising:
    a second printed circuit board, the second printed circuit board being horizontal and being perpendicular to the first printed circuit board;
    a hard drive on or adjacent to the second printed circuit board;
    a cooling air intake vent on a bottom side of the electronic device and under the hard drive;
    an exhaust fan on a rear wall of the electronic device;
    a cooling air channel positioned under at least part of the hard drive and between the cooling air intake vent and the exhaust fan; and
    a partition wall, wherein the hard drive and the cooling air channel are on one side of the partition wall and a smart card reader and a heat sink are on an opposite side of the partition wall.

15. The electronic device of claim 13, further comprising:
    a partition wall, wherein the hard drive and the cooling air channel are on one side of the partition wall and the smart card reader and the top heat sink are on an opposite side of the partition wall.

* * * * *